(12) United States Patent
Lu et al.

(10) Patent No.: US 9,698,255 B2
(45) Date of Patent: Jul. 4, 2017

(54) SEMICONDUCTOR DEVICE HAVING GATE STRUCTURE WITH DOPED HARD MASK

(71) Applicant: UNITED MICROELECTRONICS CORP., Hsin-Chu (TW)

(72) Inventors: Chia-Lin Lu, Taoyuan (TW);
Chun-Lung Chen, Tainan (TW);
Kun-Yuan Liao, Hsin-Chu (TW);
Feng-Yi Chang, Tainan (TW);
Chih-Sen Huang, Tainan (TW);
Ching-Wen Hung, Tainan (TW);
Wei-Hao Huang, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/681,119

(22) Filed: Apr. 8, 2015

(65) Prior Publication Data

US 2016/0268203 A1  Sep. 15, 2016

(30) Foreign Application Priority Data

Mar. 13, 2015  (TW) .............................. 104108137 A

(51) Int. Cl.
| | | |
|---|---|---|
| *H01L 29/78* | (2006.01) | |
| *H01L 21/311* | (2006.01) | |
| *H01L 21/768* | (2006.01) | |
| *H01L 21/3115* | (2006.01) | |
| *H01L 29/66* | (2006.01) | |

(52) U.S. Cl.
CPC ........ *H01L 29/78* (2013.01); *H01L 21/31144* (2013.01); *H01L 21/76897* (2013.01); *H01L 21/3115* (2013.01); *H01L 21/31155* (2013.01); *H01L 21/76825* (2013.01); *H01L 29/66545* (2013.01)

(58) Field of Classification Search
CPC ....... H01L 29/41775; H01L 29/411783; H01L 29/78; H01L 29/66545; H01L 21/76897; H01L 21/31144; H01L 21/76825; H01L 21/31155; H01L 21/3115
See application file for complete search history.

(56) References Cited

U.S. PATENT DOCUMENTS

| | | | |
|---|---|---|---|
| 6,437,411 B1* | 8/2002 | Choi ................. | H01L 21/02071 257/316 |
| 8,802,560 B1 | 8/2014 | Lu et al. | |
| 2012/0032238 A1* | 2/2012 | Teo ................... | H01L 21/28518 257/288 |
| 2013/0069161 A1* | 3/2013 | Yang ................ | H01L 21/76888 257/368 |
| 2013/0277767 A1* | 10/2013 | Li ......................... | H01L 29/517 257/411 |
| 2014/0312397 A1* | 10/2014 | Cheng .................. | H01L 21/283 257/288 |

\* cited by examiner

*Primary Examiner* — Robert Huber
*Assistant Examiner* — Gardner W Swan
(74) *Attorney, Agent, or Firm* — Winston Hsu

(57) ABSTRACT

A method for fabricating semiconductor device is disclosed. The method includes the steps of: providing a substrate having at least a gate structure thereon and an interlayer dielectric (ILD) layer surrounding the gate structure, wherein the gate structure comprises a hard mask thereon; forming a dielectric layer on the gate structure and the ILD layer; removing part of the dielectric layer to expose the hard mask and the ILD layer; and performing a surface treatment to form a doped region in the hard mask and the ILD layer.

8 Claims, 5 Drawing Sheets

SEMICONDUCTOR DEVICE HAVING GATE STRUCTURE WITH DOPED HARD MASK

BACKGROUND OF THE INVENTION

1. Field of the Invention

The invention relates to a method for fabricating semiconductor device, and more particularly to a method of using surface treatment to form doped region in the hard mask atop gate structure and in the interlayer dielectric layer.

2. Description of the Prior Art

In current semiconductor industry, polysilicon has been widely used as a gap-filling material for fabricating gate electrodes of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor, particularly during the stage for forming self-aligned contacts (SAC), hard mask atop metal gate is often removed excessively thereby causing contact plugs to contact metal gates directly and resulting in short circuits. Hence, how to resolve this issue has become an important task in this field.

SUMMARY OF THE INVENTION

According to a preferred embodiment of the present invention, a method for fabricating semiconductor device is disclosed. The method includes the steps of: providing a substrate having at least a gate structure thereon and an interlayer dielectric (ILD) layer surrounding the gate structure, wherein the gate structure comprises a hard mask thereon; forming a dielectric layer on the gate structure and the ILD layer; removing part of the dielectric layer to expose the hard mask and the ILD layer; and performing a surface treatment to form a doped region in the hard mask and the ILD layer.

According to another aspect of the present invention, a semiconductor device is disclosed. The semiconductor device includes: a substrate having at least a gate structure thereon and an interlayer dielectric (ILD) layer surrounding the gate structure; a hard mask on the gate structure, wherein the hard mask comprises a doped region; a source/drain region adjacent to two sides of the gate structure; and a contact plug in the ILD layer and on part of the hard mask.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
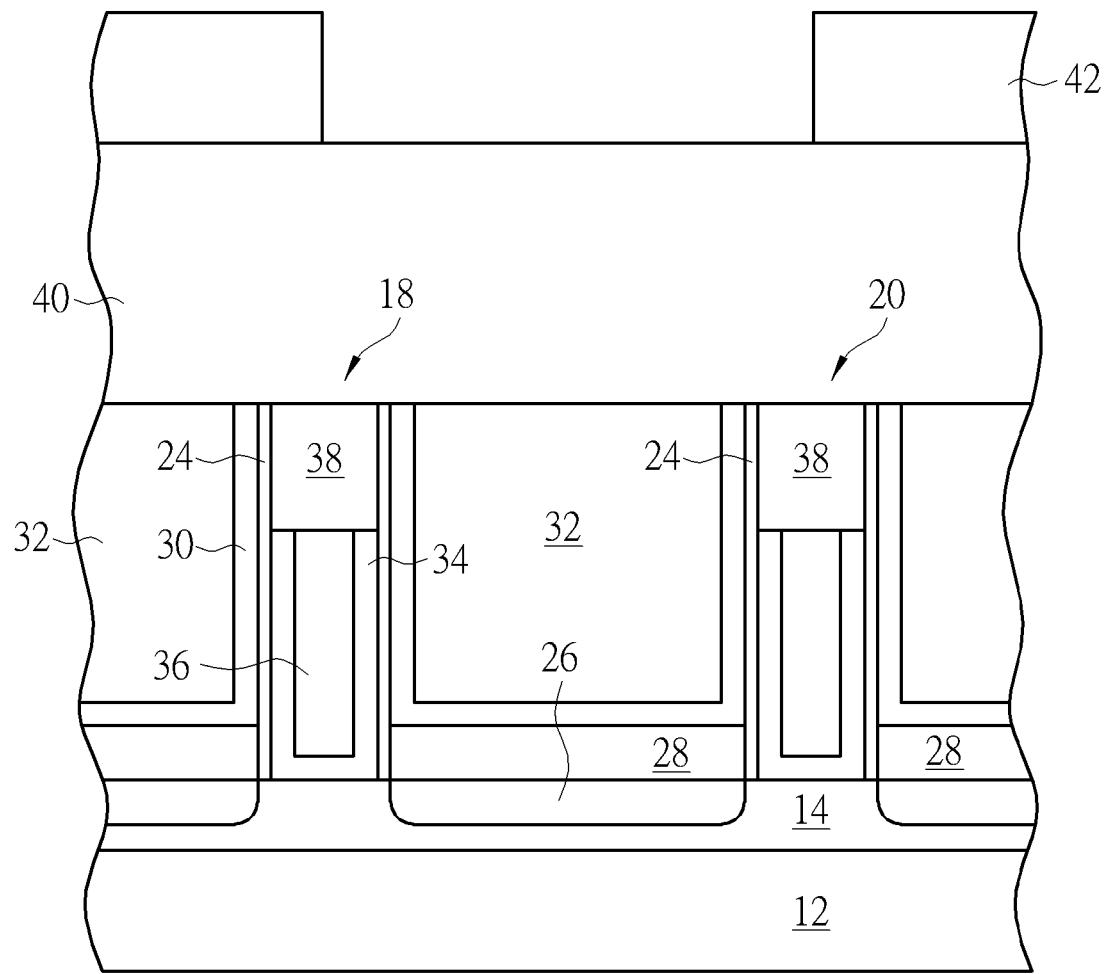
FIGS. 1-5 illustrate a method for fabricating semiconductor device according to a preferred embodiment of the present invention.

Referring to FIGS. 1-5, FIGS. 1-5 illustrate a method for fabricating semiconductor device according to a preferred embodiment of the present invention. As shown in FIG. 1, a substrate 12, such as a silicon substrate or silicon-on-insulator (SOI) substrate is provided, and a transistor region, such as a PMOS region or a NMOS region is defined on the substrate 12. At least a first fin-shaped structure 14 and an insulating layer (not shown) are formed on the substrate 12, in which the bottom of the fin-shapes structure 14 is preferably enclosed by the insulating layer, such as silicon oxide to form a shallow trench isolation (STI). A plurality of gate structures 18, 20 are formed on part of the fin-shaped structure 14. It should be noted that even though only two gate structures are disclosed in this embodiment, the quantity of the gate structures is not limited to two, but could be any quantity depending on the demand of the product.

The formation of the fin-shaped structure 14 could be accomplished by first forming a patterned mask (not shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form an insulating layer to surround the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the insulating layer could be eliminated.

The fabrication of the metal gates 18 and 20 could be accomplished by a gate first process, a high-k first approach from gate last process, or a high-k last approach from gate last process. Since this embodiment pertains to a high-k first approach, dummy gates (not shown) composed of high-k dielectric layer and polysilicon material could be first formed on the fin-shaped structure 14 and the insulating layer, and a spacer 24 is formed on the sidewall of the dummy gates. A source/drain region 26 and epitaxial layer 28 are then formed in the fin-shaped structure 14 and/or substrate 12 adjacent to two sides of the spacer 24, a contact etch stop layer (CESL) 30 is formed on the dummy gates, and an interlayer dielectric (ILD) layer 32 composed of tetraethyl orthosilicate (TEOS) is formed on the CESL 30.

Next, a replacement metal gate (RMG) process could be conducted to planarize part of the ILD layer 32 and CESL 30 and then transforming the dummy gates into metal gates. The RMG process could be accomplished by first performing a selective dry etching or wet etching process, such as using etchants including ammonium hydroxide ($NH_4OH$) or tetramethylammonium hydroxide (TMAH) to remove the polysilicon layer from dummy gates for forming a recess (not shown) in the ILD layer 32. Next, a conductive layer including at least a U-shaped work function metal layer 34 and a low resistance metal layer 36 is formed in the recess, and a planarizing process is conducted so that the surface of the U-shaped work function layer 34 and low resistance metal layer 36 is even with the surface of the ILD layer 32.

In this embodiment, the work function metal layer 34 is formed for tuning the work function of the later formed metal gates to be appropriate in an NMOS or a PMOS. For an NMOS transistor, the work function metal layer 34 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 34 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 34 and the low resistance metal layer 36, in which the material of the barrier layer may include titanium (Ti), titanium nitride (TiN), tantalum (Ta) or tantalum nitride (TaN). Furthermore, the material of the low-resistance metal layer 36 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

After forming the metal gates 18 and 20, part of the work function metal layer 34 and low resistance metal layer 36 could be removed to form a recess between the spacer 24, and a hard mask 38 is formed on the work function metal layer 34 and the low resistance metal layer 36. The hard mask 38 could be a single material layer or composite material layer, such as a composite layer containing both silicon oxide and silicon nitride.

Next, a dielectric layer 40 and a mask layer (not shown) is formed on the ILD layer 32 and covering the gate structures 18 and 20, and a photo-etching process is conducted to remove part of the mask layer for forming a patterned mask 42 on the dielectric layer 40. In this embodiment, the dielectric layer 40 is preferably composed of silicon oxide and the patterned mask 42 is composed of TiN, but not limited thereto.

Figure 2:
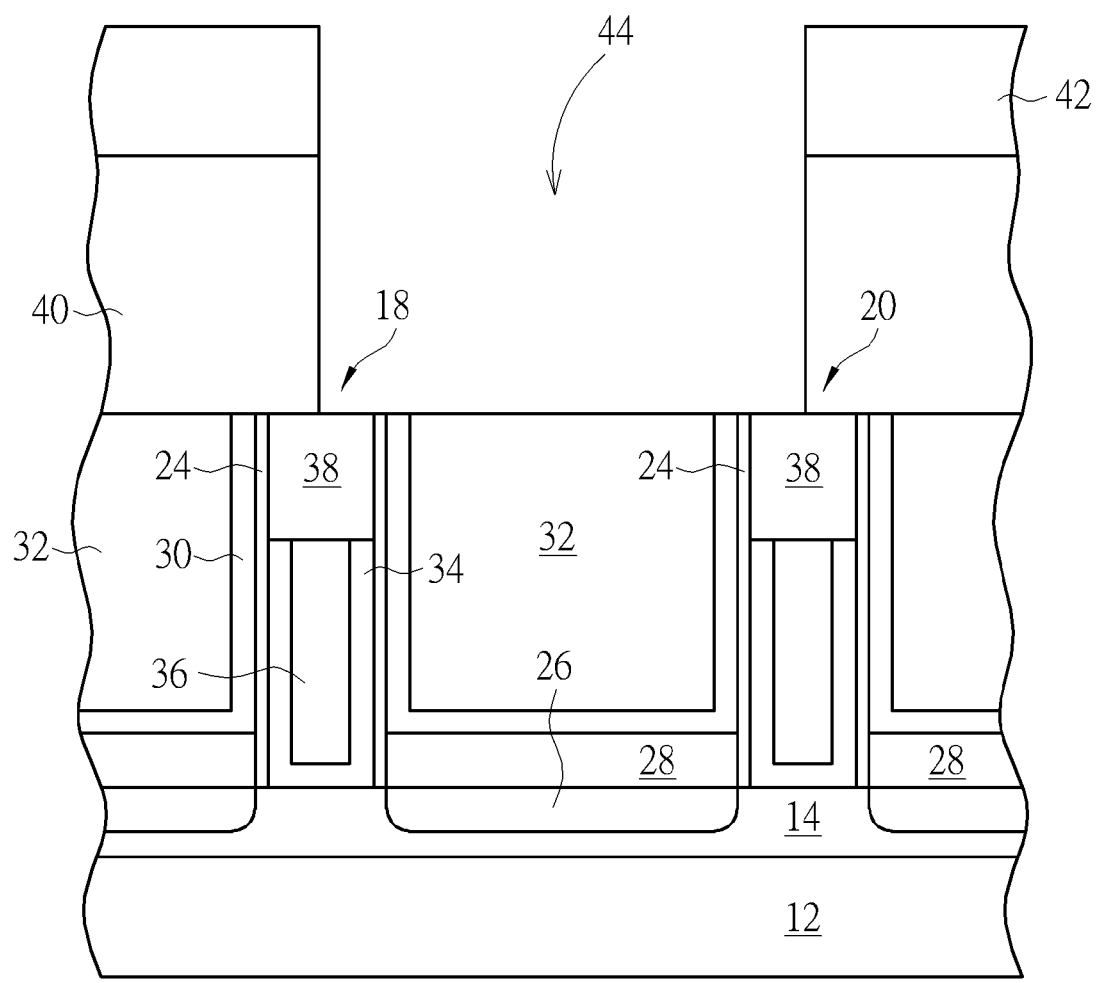

Next, as shown in FIG. 2, an etching process is conducted by using the patterned mask 42 as mask to remove part of the dielectric layer 40 for forming an opening 44 or via hole exposing part of the hard mask 38 atop the gate structures 18 and 20 and the ILD layer 32 between the gate structures 18 and 20.

Figure 3:
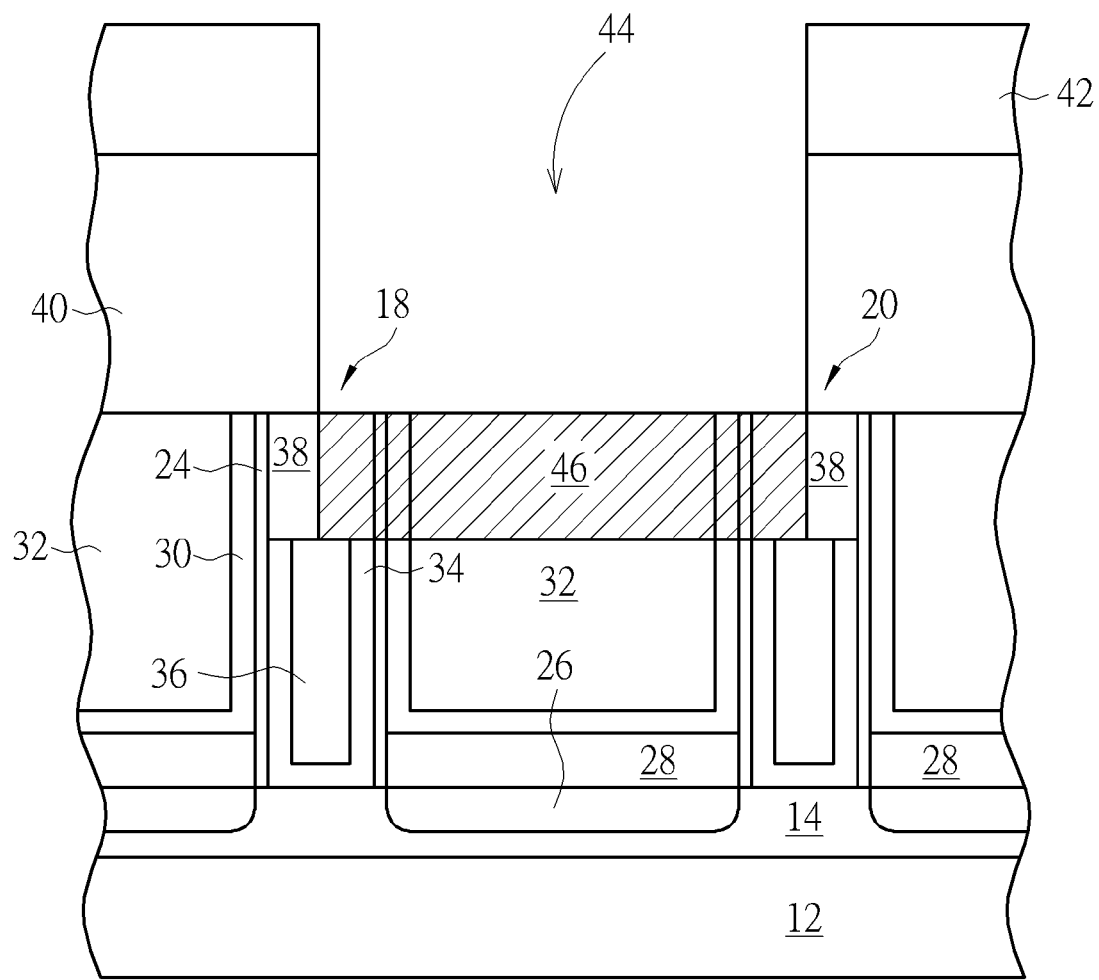

Next, as shown in FIG. 3, a surface treatment is conducted to form a doped region 46 in part of the hard mask 38 and part of the ILD layer 32. In this embodiment, the surface treatment could be accomplished by using an ion implantation process or solid-state diffusion (SSD) technique to inject boron or carbon ions into hard mask 38 and ILD layer 32 for forming the doped region 46. Preferably, the ion implantation is conducted by directly implant ions into targets such as hard masks 38 while the SSD approach is accomplished by first covering a doped layer (not shown) containing ions, such as a borosilicate glass (BSG) layer on the hard mask 38 and ILD layer 32, and then conducting an anneal process to drive the ions or dopants from the doped layer into hard mask 38 and ILD layer 32 for forming the doped region 46. The doped layer is then removed thereafter.

More specifically, the ions implanted through ion implantation or SSD are preferably reacted with all elements exposed from the opening 44, including hard mask 38, spacer 24, CESL 30, and ILD layer 32 to form doped region 46. If boron ions were chosen as designated ions to be implanted and if hard mask 38, spacer 24, and CESL 30 all include silicon nitride and ILD layer 32 include oxides, the boron ions implanted through ion implantation or SSD process would react with silicon nitride and oxides to form doped region 46 containing boron nitride in the hard mask 38, spacer 24, and CESL 30 and doped region 46 containing boron oxide in the ILD layer 32.

It should be noted that even though the doped regions 46 are formed in the hard mask 38, spacer 24, CESL 30, and ILD layer 32 at the same time, the doped region 46 containing boron oxide formed within the ILD layer 32 preferably does not alter the rate of etching process whereas the doped regions 46 containing boron nitride formed within the hard mask 38, spacer 24, and CESL 30 lower the rate of etching process significantly. In other words, while the ILD layer 32 is removed according to regular etching rate during the formation of opening or via hole thereafter, the hard mask 38, spacer 24, and CESL 30 are preferably protected by the doped regions 46 during the formation of opening or via hole thereafter.

Figure 4:
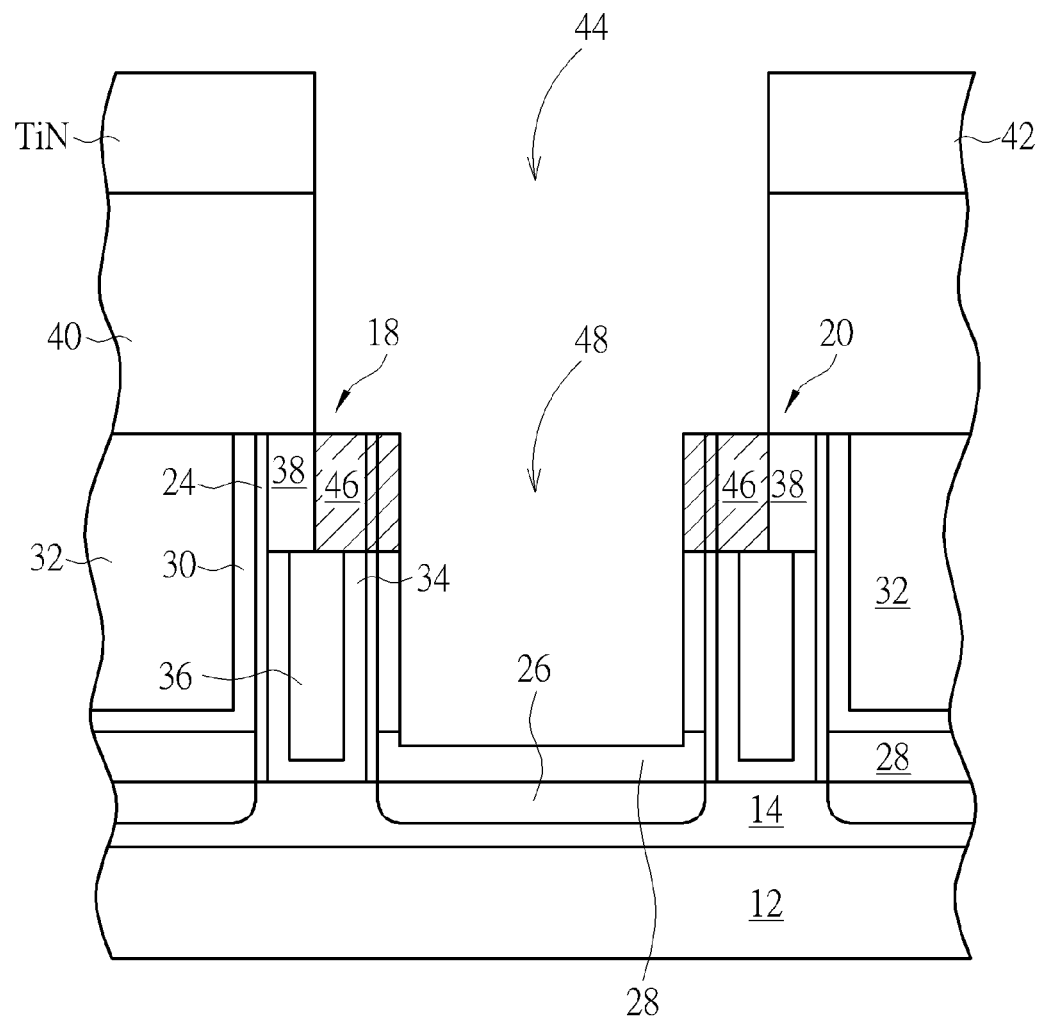

Next, as shown in FIG. 4, another etching process is conducted by using the patterned mask 42 as mask to remove part of the ILD layer 32 adjacent to the gate structures 18 and 20 for forming another opening 48 or via hole exposing the epitaxial layer 28.

Figure 5:
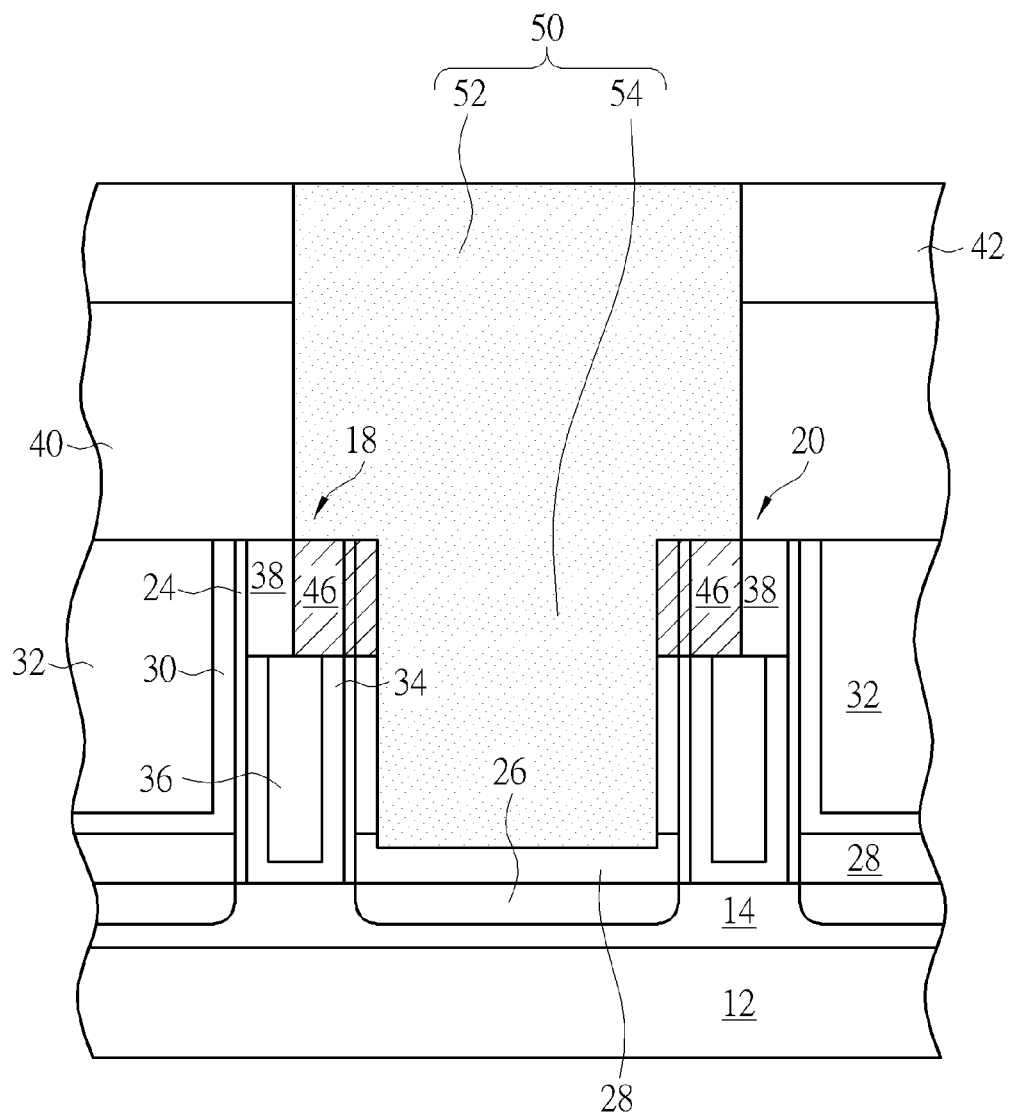

Next, as shown in FIG. 5, metals are deposited into the openings 44 and 48 and a planarizing process, such as chemical mechanical polishing (CMP) process is conducted to remove part of the metals for forming a contact plug 50 on part of the gate structures 18 and 20 and electrically connected to the source/drain region 26, in which the contact plug 50 further includes a trench conductor 52 and a via conductor 54. According to an embodiment of the present invention, it would also be desirable to conduct a silicide process to form a silicide layer atop the epitaxial layer 28 before depositing metal into the openings 44 and 48. Since the formation of contact plug 50 is well known to those skilled in the art, the details of which are not explained herein for the sake of brevity. This completes the fabrication of a semiconductor device according to a preferred embodiment of the present invention.

Referring again to FIG. 5, which further illustrates a structural view of a semiconductor device according to a preferred embodiment of the present invention. As shown in FIG. 5, the semiconductor device includes a substrate 12, at least a gate structure 18 on the substrate 12, an ILD layer 32 surrounding the gate structure 18, a hard mask 38 disposed on the gate structure 18, a doped region 46 formed in part of the hard mask 38, a source/drain region 28 disposed in the substrate 12 adjacent to two sides of the gate structure 18, a dielectric layer 40 on the ILD layer 32 and part of the hard mask 38, and a contact plug 50 disposed in the dielectric layer 40 and ILD layer 32 and also on part of the hard mask 38.

In this embodiment, the doped region 46 is formed not only in part of the hard mask 38, but also in part of spacer 24 and part of CESL 30 adjacent to the hard mask 38, in which the edge of the doped region 46 preferably not exceeding the edge of the trench conductor 52 while the depth of the doped region 46 preferably not exceeding the bottom surface of the hard mask 38. The doped region 46 of this embodiment preferably includes boron or carbon, but not limited thereto. Moreover, despite the aforementioned embodiment pertains to a FinFET device, it would also be desirable to apply the present invention to other non-planar MOS transistors, non-conventional non-planar MOS transistors, or any other semiconductor devices having hard mask undergoing dielectric layer etching process such that the doped region could prevent hard masks from being damaged by etchant in the manner disclosed in the aforementioned embodiments.

Overall, the present invention preferably conducts a surface treatment before forming contact plug to inject ions such as boron or carbon into hard mask atop the gate structure as well as ILD layer surrounding the gate structure for forming a doped region. The doped region preferably creates a difference in etching selectivity between the ILD layer and surrounding hard mask, spacer, and CESL so that when part of ILD layer is removed for forming contact holes or via holes, the hard mask, spacer, and CESL could be protected from having damages caused by etchant used during the formation of contact holes. This further prevents the contact plug formed thereafter from directly contacting the gate structure thereby causing short circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having at least a gate structure thereon and an interlayer dielectric (ILD) layer surrounding the gate structure;
   a hard mask on the gate structure, wherein the hard mask comprises a doped region and an undoped region;
   a source/drain region adjacent to two sides of the gate structure; and
   a contact plug in the ILD layer and on part of the hard mask, wherein a vertical edge of the contact plug is aligned and extends continuously to a vertical boundary between the doped region and the undoped region and each of the vertical edge and the vertical boundary are orthogonal to a top surface of the substrate.

2. The semiconductor device of claim 1, further comprising a dielectric layer on the ILD layer and on part of the hard mask.

3. The semiconductor device of claim 2, wherein the contact plug is in part of the dielectric layer.

4. The semiconductor device of claim 1, wherein the doped region comprises boron or carbon.

5. The semiconductor device of claim 1, further comprising a contact etch stop layer (CESL) adjacent to the gate structure, wherein the CESL comprises a second doped region.

6. The semiconductor device of claim 5, wherein a bottom surface of the doped region in the hard mask is even with a bottom surface of the second doped region.

7. The semiconductor device of claim 1, further comprising a spacer around the gate structure and a third doped region in part of the spacer.

8. The semiconductor device of claim 7, wherein a bottom surface of the doped region in the hard mask is even with a bottom surface of the third doped region in the spacer.

* * * * *